(12) United States Patent
Yukawa (10) Patent No.: US 7,129,882 B2
(45) Date of Patent: Oct. 31, 2006

(54) SUCCESSIVE APPROXIMATION AD CONVERTER HAVING PULSE NOISE SUPPRESSION

(75) Inventor: Akira Yukawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/101,559

(22) Filed: Apr. 8, 2005

(65) Prior Publication Data

US 2005/0225471 A1   Oct. 13, 2005

(30) Foreign Application Priority Data

Apr. 9, 2004   (JP) .............................. 2004-115334

(51) Int. Cl.
H03M 1/34   (2006.01)
(52) U.S. Cl. ....................................... 341/163; 341/155
(58) Field of Classification Search ................ 341/155, 341/172, 144, 163, 161
See application file for complete search history.

(56) References Cited

U.S. PATENT DOCUMENTS

| | | | | |
|---|---|---|---|---|
| 3,810,031 | A * | 5/1974 | Poujois ........................... | 330/6 |
| 6,252,454 | B1 * | 6/2001 | Thompson et al. ............. | 330/9 |
| 6,653,967 | B1 * | 11/2003 | Hamashita .................... | 341/172 |
| 6,803,870 | B1 * | 10/2004 | Kuttner ........................ | 341/155 |
| 6,867,723 | B1 * | 3/2005 | Tachibana et al. ........... | 341/155 |

2001/0048344  A1 *  12/2001  Isken et al. ..................... 330/9

FOREIGN PATENT DOCUMENTS

| | | |
|---|---|---|
| JP | 61-126823 | 6/1986 |
| JP | 63-253726 | 10/1988 |
| JP | 2001-292053 | 10/2001 |

OTHER PUBLICATIONS

David A. Hodges, et al., "Potential of MOS Technologies for Analog Integrated Circuits", IEEE Journal of Solid-State Circuits, vol. SC-13, No. 3, Jun. 1978.

* cited by examiner

Primary Examiner—Peguy JeanPierre
(74) Attorney, Agent, or Firm—McGinn IP Law Group, PLLC (57) ABSTRACT

A successive approximation AD converter. A voltage comparator receives an analog input signal and a reference voltage. A successive approximation register receives the voltage comparator output, and a DA converter, connected to the successive approximation register, provides another analog signal to the voltage comparator. The voltage comparator includes differential amplifiers and an output amplifier connected in series via capacitance pairs, a first switch connecting the analog input signal to the first differential amplifier, a second switch connecting the first switch and the sampling capacitor to the reference voltage supply section, and a third switch connecting the first switch and the first differential amplifier to the reference voltage. When the input analog signal is sampled, the first switch is switched OFF, and the second and third switches are switched ON. When a voltage comparison is executed, the first switch is switched ON, and the second and third switches are switched OFF.

9 Claims, 7 Drawing Sheets

SUCCESSIVE APPROXIMATION AD CONVERTER HAVING PULSE NOISE SUPPRESSION

BACKGROUND OF THE INVENTION

1. Field of the Invention

The present invention relates to an AD converter, and more particularly to a configuration of a voltage comparator having a sample hold which is used in a successive approximation AD converter.

2. Description of the Related Art

Figure 2:
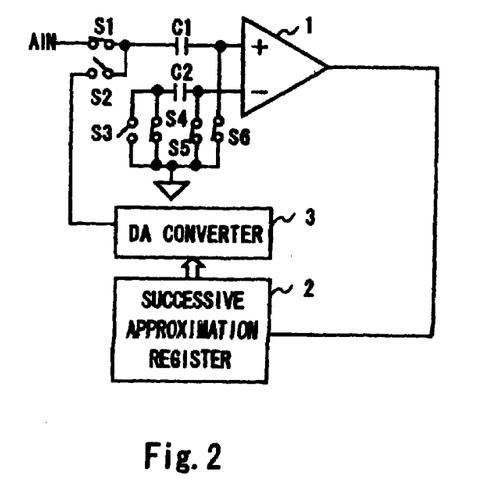
FIG. 2 is a circuit diagram showing the constitution of the AD converter.

FIG. 2 shows the configuration of a conventional successive approximation AD converter. This AD converter is realized by a MOS integrated circuit, and comprises a voltage comparator 1, a successive approximation register 2, and a DA converter 3. The voltage comparator 1 has both a function for sampling an input analog signal and a function for performing a voltage comparison. The positive input terminal of the voltage comparator 1 is connected to a capacitor C1 serving as a sampling capacitor. An analog signal AIN to be subjected to AD conversion is input-into the positive input terminal of the voltage comparator 1 via a switch S1 and the capacitor C1. A connection point between the positive input terminal of the voltage comparator 1 and the capacitor C1 is biased to a reference voltage VR via a switch S6.

The negative input terminal of the voltage comparator 1 is connected to one end of a capacitor C2 and biased to the reference voltage VR via a switch S5. The other end of the capacitor C2 is biased to the reference voltage VR via switches S3, S4.

The successive approximation register 2 is connected to an output terminal of the voltage comparator 1, and holds an output signal from the voltage comparator 1. The DA converter 3 converts the data in the successive approximation register 2 into an analog signal. The output terminal of the DA converter 3 is connected to the positive input terminal of the voltage comparator 1 via a switch S2 and the capacitor C1.

The voltage comparator 1 used in the successive approximation AD converter described above is constituted as shown in FIG. 3, for example. Differential amplifiers 11, 12 and a final amplifier 13 are connected by multi-stage capacitive couplings. Switches S5 through S10 supplying the reference voltage VR are connected on each differential stage. The basic form of this circuit is disclosed in "Potential of MOS Technologies for Analog Integrated Circuits", IEEE Journal of Solid-State Circuits, Vol. SC-13, No. 3, June 1978, for example.

Figure 4:
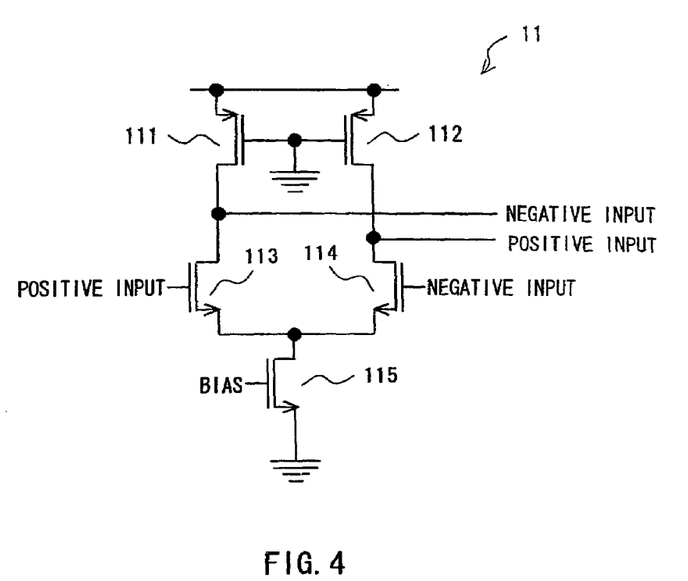
FIG. 4 is a circuit diagram showing the constitution of a differential amplifier circuit in the voltage comparator of the AD converter.
Figure 5:
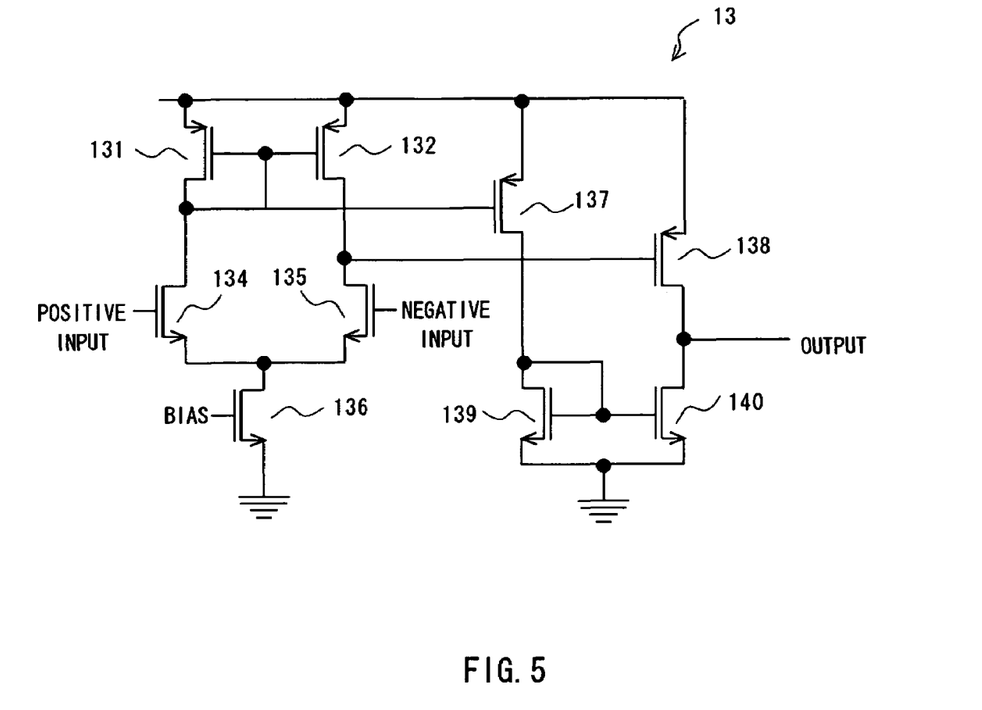
FIG. 5 is a circuit diagram showing the constitution of a final amplifier in the voltage comparator of the AD converter.

Further, the differential amplifiers 11, 12 used in the voltage comparator 1 are constituted as shown in FIG. 4, for example. A transistor 113 having a gate electrode serving as a positive input and a transistor 114 having a gate electrode serving as a negative input are connected in series respectively to transistors 111, 112 each having grounded gate electrodes, and the transistors 113, 114 are grounded via a bias transistor 115. The final amplifier 13 of the voltage comparator 1 has a configuration such as that shown in FIG. 5, for example, in which transistors 131 through 140 are wired.

Figure 3:
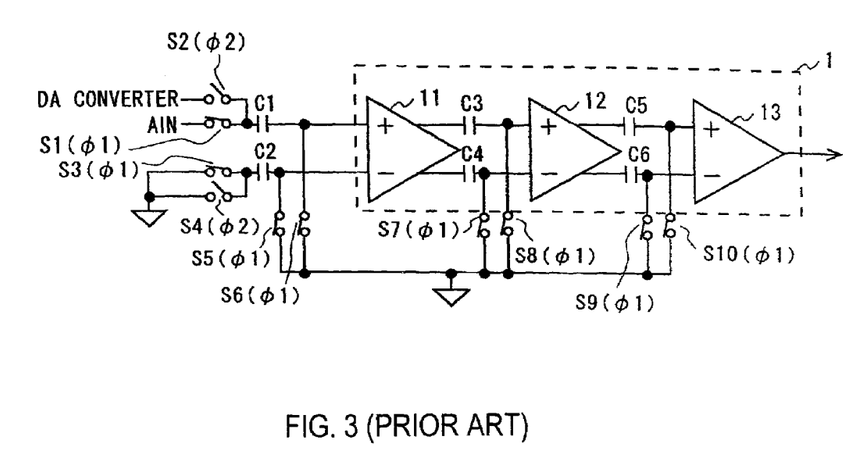
FIG. 3 is a circuit diagram showing the constitution of a voltage comparator in a conventional AD converter.
Figure 8:
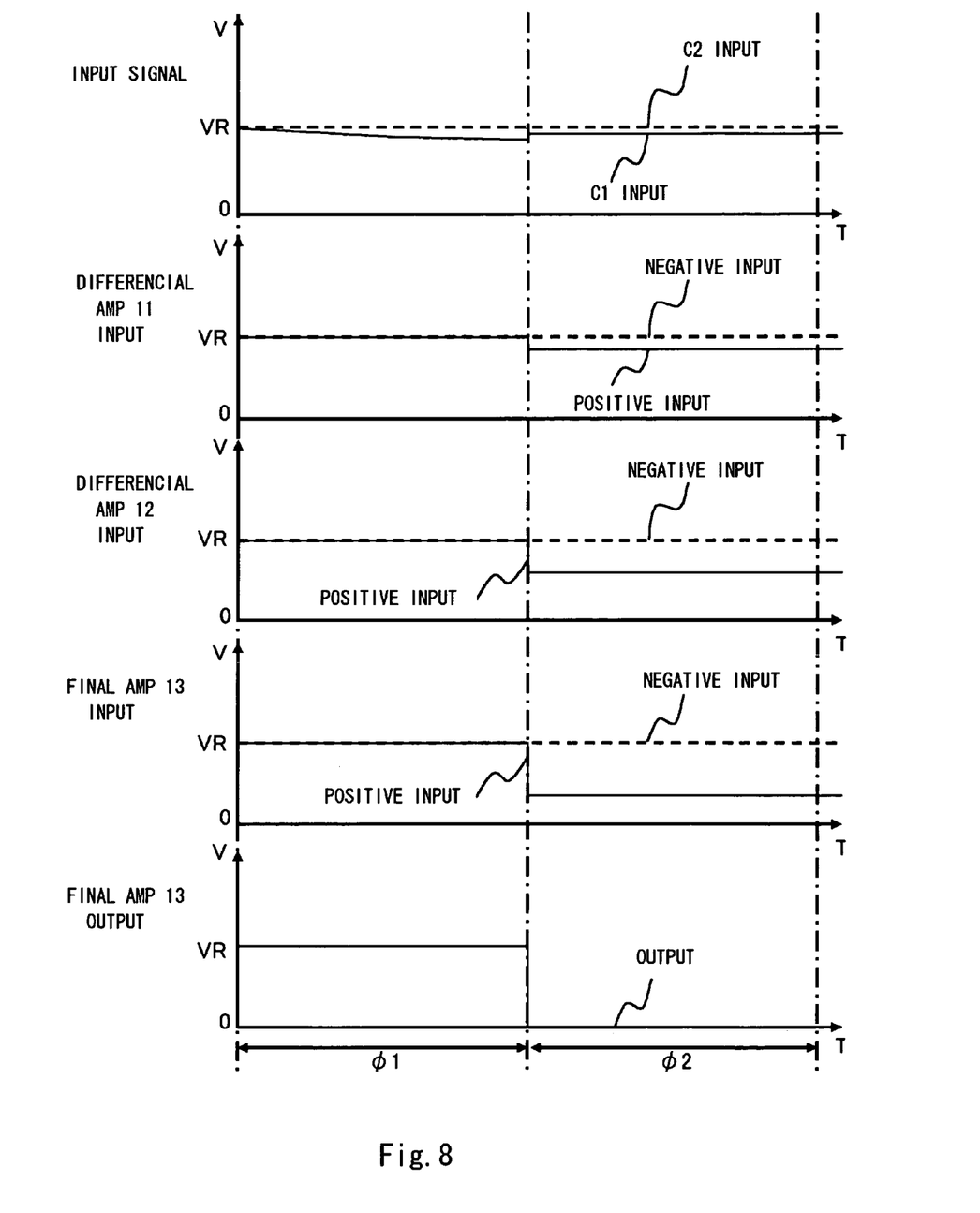
FIG. 8 is a timing chart showing signal wave forms at points in the voltage comparator in the conventional AD converter.
Figure 9:
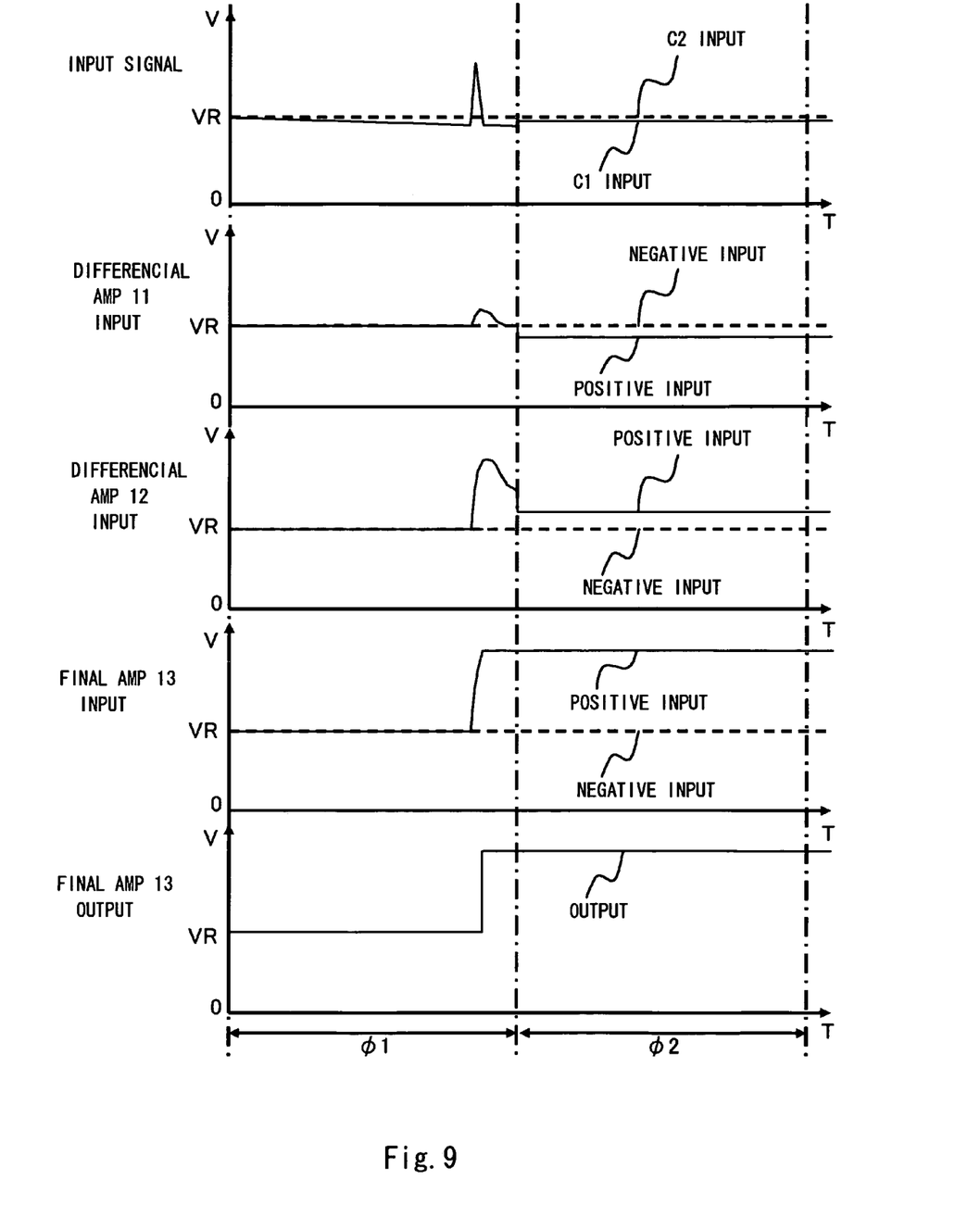
FIG. 9 is a timing chart showing signal wave forms at points in the voltage comparator in the conventional AD converter.

Next, an operation of the conventional voltage comparator 1 shown in FIG. 3 will be described in reference to timing charts shown in FIGS. 8 and 9. The voltage comparator 1 performs an input signal sampling operation and a voltage comparing operation alternately. In FIG. 3, the symbol φ1 is annexed to switches that are ON when an input signal is sampled, and the symbol φ2 is annexed to switches that are ON when voltage comparison is performed. The timing chart of FIG. 8 shows a signal wave forms at points including the input of the comparator 1, the inputs of the differential amplifiers 11, 12, and the inputs and outputs of the final amplifier 13, in the conventional voltage comparator 1 in the case where a noise is not input to the comparator 1, the timing chart of FIG. 9 shows those in the case where a noise is input to the comparator 1. In the timing charts of FIGS. 8 and 9, an input signal is sampled during the first half period (φ1) and voltage comparison is performed during the last half period (φ2).

First, an input signal sampling operation shown in FIG. 8 will be described. At the timing of this operation, the switches S1, S3, S5, S6, S7, S8, S9, and S10 are ON, and the remaining switches S2, S4 are OFF. First, an input analog signal is stored in the capacitor C1. The voltage serving as a reference is the voltage VR supplied via the switches S5, S6.

Both of the input voltages of the differential amplifier 11 are the reference voltage VR, and the output voltage is a voltage produced by amplifying an offset voltage. The input terminals of the second stage differential amplifier 12 are connected to the input terminals of the differential amplifier 11 via the switches S5, S6, S7, S8, and hence the input voltages of this differential amplifier 12 are also the reference voltage VR. Likewise, the output voltage of the second stage differential amplifier 12 is also a voltage produced by amplifying an offset voltage, similarly to the first stage of the differential amplifier 11. The third stage is the same. Since the amplification stages are capacitively coupled in this manner and each stage is input with the reference voltage VR, the first stage offset voltage is not transmitted to the latter stages. Hence the offset voltage of the entire amplification circuit becomes the offset voltage of the final stage, i.e. the final amplifier 13. Thus with a three-stage configuration as shown in this example, the offset voltage calculated upon input can be considered as a fraction of the gain of the previous two stages, and hence can be reduced in magnitude considerably.

Next, a voltage comparison operation will be described. During the period of this operation, the switches S2, S4 annexed with the symbol φ2 in FIG. 3 are ON, and the other switches S1, S3, S5, S6, S7, S8, S9, S10 are OFF. The inputs of each differential stage (the differential amplifiers 11, 12 and the final amplifier 13) are removed from the reference voltage VR since the switches S15 through S20 are OFF. As a result, the differential amplifiers 11, 12 and the final amplifier 13 perform amplification in accordance with the variation in the inputs. Thus the comparison operation is performed.

As shown in FIG. 9, a pulsing noise may intrude immediately before the completion of sampling. In this case, the reference voltage VR is supplied to the inputs of the differential amplifiers 11, 12 and final amplifier 13 through the switches S5, S6, S7, S8, S9, S10, and hence has a time constant with the capacitors C1, C2, C3, C4, C5, C6. Therefore, the path that is charged from the reference voltage VR through the switches S5 through S10 cannot follow this noise. On the other hand, the response of the differential amplifiers 11, 12 and the final amplifier 13 is sometimes sufficiently fast.

In such a case, the differential amplifier 11 is not fixed to the reference voltage VR, and therefore executes amplification as shown in FIG. 9. The amplified noise is then output from the differential amplifier 11 and held in the capacitors C3, C4. For example, a voltage which is approximately equal to the voltage amplitude is generated. The sampling cycle may then end while such a large voltage is generated.

The differential amplifiers 11, 12 are designed to have an amplification factor of approximately ten to prevent the output voltage from saturating even when an offset voltage is present in order to increase the response speed, and are also designed such that the output amplitude is voltage-restricted to less than half of the supply voltage so as not to exceed the supply voltage following capacitive coupling and transmission to the next differential stage. When a comparison operation starts with a large voltage differential, since the output amplitude of the differential stage is restricted, the voltage differential cannot be eliminated, and hence the voltage comparator is fixed in a 0 or 1 state. As a result, the output of the AD converter outputs all 0 data or all 1 data.

Thus with a conventional AD converter, a disadvantage exists in that if a pulsing noise arises immediately before the completion of sampling, the output of the AD converter outputs all 0 data or all 1 data.

SUMMARY OF THE INVENTION

According to one aspect of the present invention, there is provided a successive approximation AD converter comprising a voltage comparator having a first terminal which is connected to an input terminal for an analog signal via a sampling capacitor, and a second terminal into which a reference voltage is input from reference voltage supply section, a successive approximation register connected to an output terminal of the voltage comparator and a DA converter for converting data in the successive approximation register into an analog signal and inputting the analog signal into the first input terminal of the voltage comparator, the voltage comparator comprising two or more differential amplifiers connected in series via a capacitance pair, a first switch connected between the sampling capacitor and a first stage of the differential amplifiers, a second switch connected between a connection point between the first switch and the sampling capacitor and the reference voltage supply section and a third switch connected between a connection point between the first switch and the first stage of the differential amplifiers and the reference voltage supply section. When the input analog signal is sampled, the first switch is switched OFF, and the second switch and third switch are switched ON, and when a voltage comparison is executed, the first switch is switched ON, and the second switch and third switch are switched OFF.

According to another aspect of the present invention, there is provided a successive approximation AD converter comprising a voltage comparator having a first terminal which is connected to an input terminal via a sampling capacitor, and a second terminal into which a reference voltage is input, a successive approximation register connected to an output terminal of the voltage comparator and a DA converter for converting data in the successive approximation register into an analog signal and inputting the analog signal into the first input terminal of the voltage comparator. The voltage comparator comprises two or more differential amplifiers connected in series via a capacitance pair and disconnection section disconnecting an input terminal of a first stage of the differential amplifiers and the sampling capacitor when the input analog signal is sampled.

According to another aspect of the present invention, there is provided a voltage comparator with a sample hold used in a successive approximation AD converter, having a first terminal connected to an input terminal via a sampling capacitor, and a second terminal into which a reference voltage is input, comprising two or more differential amplifiers connected in series via a capacitance pair, a first switch connected between the sampling capacitor and a first stage of the differential amplifiers, a second switch connected between a connection point between the first switch and the sampling capacitor and reference voltage supply section and a third switch connected between a connection point between the first switch and the first stage of the differential amplifiers and the reference voltage supply section. When an input analog signal is sampled, the first switch is switched OFF, and the second switch and third switch are switched ON, and when a voltage comparison is executed, the first switch is switched ON, and the second switch and third switch are switched OFF.

According to the present invention, an AD converter which is capable of avoiding a situation in which all 1 data or all 0 data are output, even when a pulsing noise occurs immediately before the completion of sampling.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The overall configuration of a successive approximation AD converter according to the present invention is as shown in FIG. 2. This AD converter is realized by a MOS integrated circuit, and comprises a voltage comparator 1, a successive approximation register 2, and a DA converter 3. The voltage comparator 1 has both a function for sampling an input analog signal and a function for performing a voltage comparison. The positive input terminal of the voltage comparator 1 is connected to a capacitor C1 serving as the sampling capacitor. An analog signal AIN to be subjected to AD conversion is input into the positive input terminal of the voltage comparator 1 via a switch S1 and the capacitor C1. A connection point between the positive input terminal of the voltage comparator 1 and the capacitor C1 is biased to a reference voltage VR via a switch S6.

The negative input terminal of the voltage comparator 1 is connected to one end of a capacitor C2 and biased to the reference voltage VR via a switch S5. The other end of the capacitor C2 is biased to the reference voltage. VR via switches S3, S4.

The successive approximation register 2 is connected to an output terminal of the voltage comparator 1, and holds an output signal from the voltage comparator 1. The DA converter 3 converts the data in the successive approximation register 2 into an analog signal. The output terminal of the DA converter 3 is connected to the positive input terminal of the voltage comparator 1 via a switch S2 and the capacitor C1.

The voltage comparator 1 used in the successive approximation AD converter described above is constituted as shown in FIG. 1. Differential amplifiers 11, 12 and a final amplifier 13 are connected by multi-stage capacitive couplings. More specifically, the differential amplifier 11 and differential amplifier 12 are capacitively coupled by capacitors C3, C4 serving as a capacitance pair, and the differential amplifier 12 and final amplifier 13 are capacitively coupled by capacitors C5, C6 serving as a capacitance pair.

Figure 1:
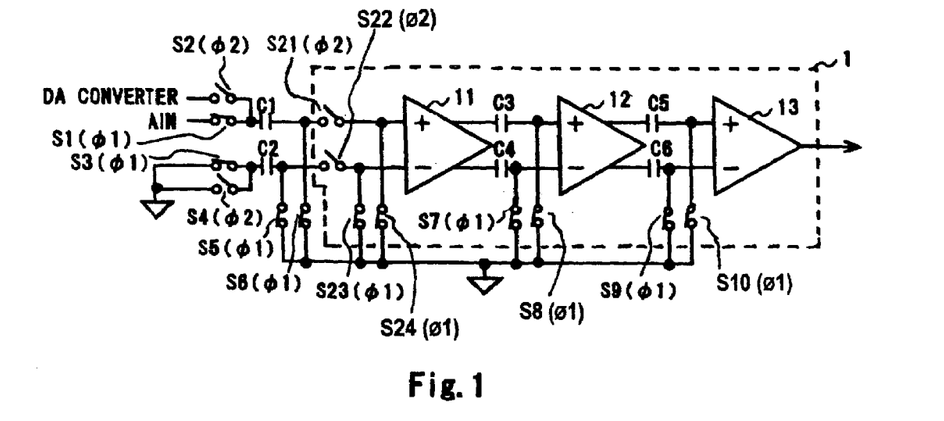
FIG. 1 is a circuit diagram showing the constitution of a voltage comparator in an AD converter according to the present invention.

Switches S5 through S10 for supplying the reference voltage VR are connected to each differential stage. More specifically, a connection point between the capacitor C1 and a switch S21 is connected to a supply terminal of the reference voltage VR via the switch S6. Note that the reference voltage VR is supplied by reference voltage supply section not shown in the drawing. Further, the connection point between the capacitor C2 and a switch S22 is connected to the supply terminal of the reference voltage VR via the switch S5. Likewise, the connection point between the switch S21 and the positive input terminal of the differential amplifier 11 is connected to the supply terminal of the reference voltage VR via the switch S24, and the connection point between the switch S22 and the negative input terminal of the differential amplifier 11 is also connected to the supply terminal of the reference voltage VR. Further, the connection point between the capacitor C3 and the positive input terminal of the differential amplifier 12, and the connection point between the capacitor C4 and the negative input terminal of the differential amplifier 12 are connected to the supply terminal of the reference voltage VR via the switch S8 and the switch S7 respectively. Also, the connection point between the capacitor C5 and the positive input terminal of the final amplifier 13, and the connection point between the capacitor C6 and the negative input terminal of the final amplifier 13 are connected to the supply terminal of the reference voltage VR via the switch S10 and the switch S9 respectively.

The differential amplifiers 11, 12 used in the voltage comparator 1 are constituted as shown in FIG. 4, for example. The final amplifier 13 of the voltage comparator 1 has a constitution such as that shown in FIG. 5, for example.

Figure 6:
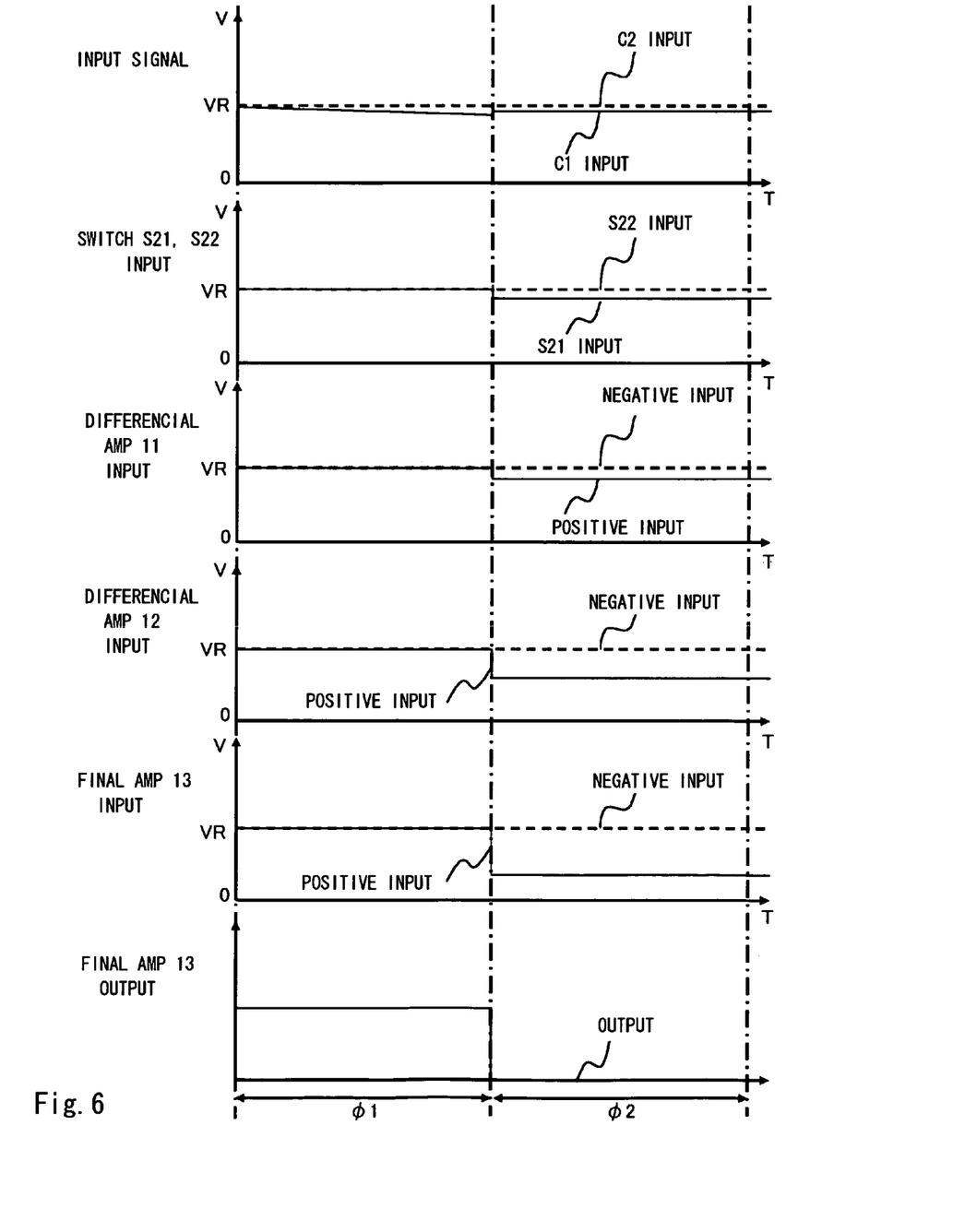
FIG. 6 is a timing chart showing signal wave forms at points in the voltage comparator in the AD converter according to the present invention.
Figure 7:
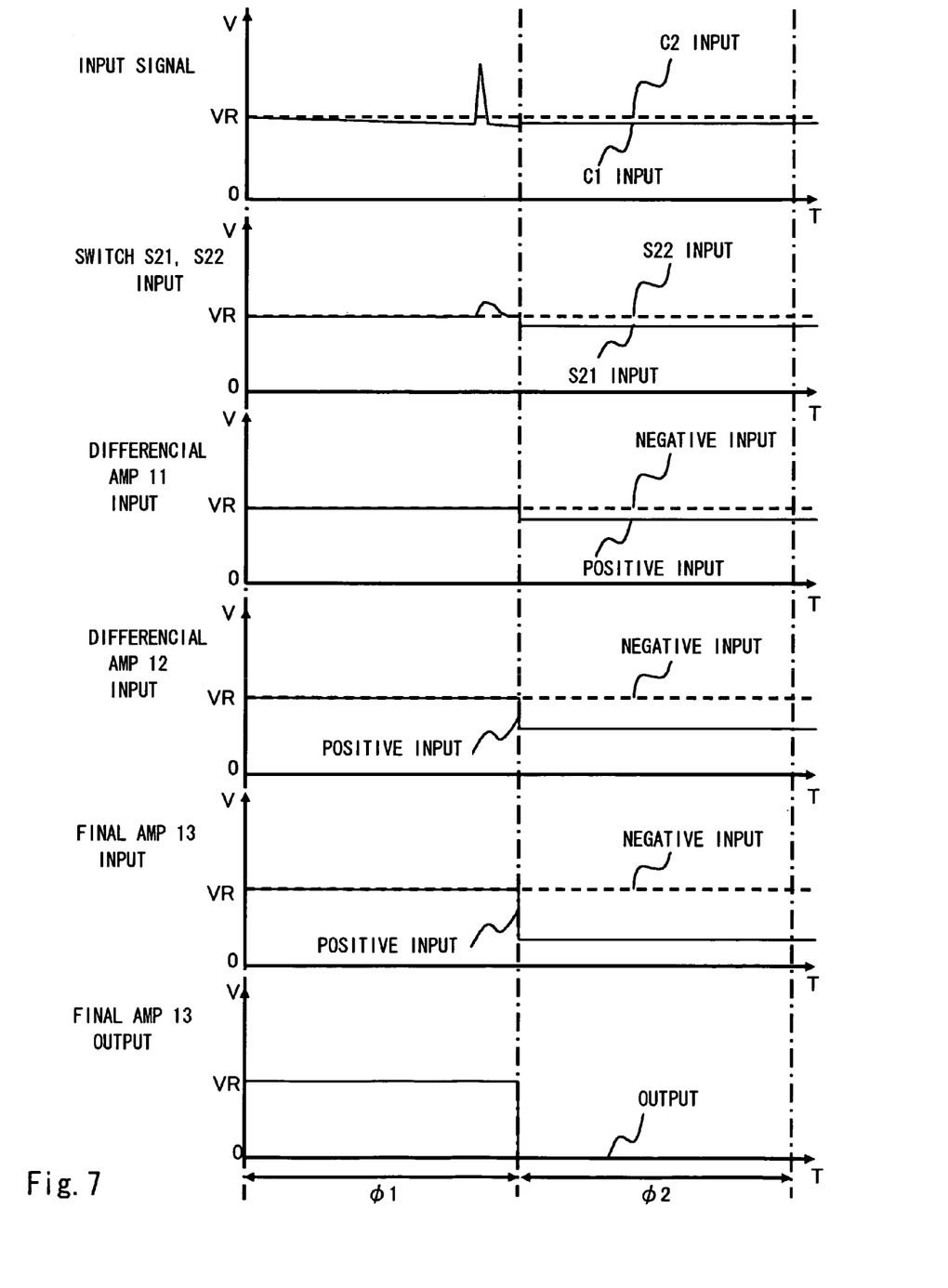
FIG. 7 is a timing chart showing signal wave forms at points in the voltage comparator in the AD converter according to the present invention.

Next, an operation of the voltage comparator 1 according to the present invention and shown in FIG. 1 will be described. The voltage comparator 1 performs an input signal sampling operation and a voltage comparing operation alternately. In FIG. 1, the symbol φ1 is annexed to switches that are ON when an input signal is sampled, and the symbol φ2 is annexed to switches that are ON when voltage comparison is performed. The timing chart of FIG. 6 shows a signal wave forms at points including the input of the comparator 1, the inputs of the switches S21 and S22, the inputs of the differential amplifiers 11, 12, and the inputs and outputs of the final amplifier 13, in the voltage comparator 1 in the case where a noise is not input to the comparator 1, the timing chart of FIG. 7 shows those in the case where a noise is input to the comparator 1. In the timing charts of FIGS. 6 and 7, an input signal is sampled during the first half period (φ1) and voltage comparison is performed during the last half period (φ2).

First, an input signal sampling operation shown in FIG. 6 will be described. In the voltage comparator 1 shown in FIG. 1, the switches S1, S3, S5, S6, S7, S8, S9, S10, S23, and S24 are ON, and the remaining switches S2, S4, S21, S22 are OFF.

An input analog signal is stored in the capacitor C1. The capacitor C2 is charged by the reference voltage VR supplied via the switch S3, S4, which is ON. The reference voltage VR is also supplied the connection point between the capacitor C1 and the switch 21 and the connection point between the capacitor C2 and the switch S6, S5 respectively.

Since the reference voltage VR is supplied via the switches S23, S24, which are ON, both of the input voltages of the differential amplifier 11 are the reference voltage VR, and the output voltage is a voltage produced by amplifying an offset voltage. The input terminals of the second stage differential amplifier 12 are connected to the input terminals of the differential amplifier 11 via the switches S5, S6, S7, S8, and hence the input voltages of this differential amplifier 12 are also the voltage VR. Likewise, the output voltage of the second stage differential amplifier 12 is also a voltage produced by amplifying an offset voltage, similarly to the first stage of the differential amplifier 11. The third stage is the same. Since the amplification stages are capacitively coupled in this manner and each stage is input with the reference voltage VR, the first stage offset voltage is not transmitted to the latter stages. Hence the offset voltage of the entire amplification circuit becomes the offset voltage of the final stage, i.e. the final amplifier 13. Therefore, with a three-stage constitution such as the one in this example, the offset voltage calculated upon input can be considered as a fraction of the gain of the previous two stages, and hence can be reduced in magnitude considerably.

Next, a voltage comparison operation will be described. During the period of this operation, the switches S2, S4 annexed with the symbol φ2 in FIG. 1 are ON, and the other switches S1, S3, S5, S6, S7, S8, S9, S10 are OFF. At this timing, in the successive approximation AD converter shown in FIG. 2, the switch S1 is OFF, and the switch S2 is ON. The inputs of each differential stage (the differential amplifiers 11, 12 and the final amplifier 13) are removed from the reference voltage VR since the switches S15 through S20 are OFF. As a result, the differential amplifiers 11, 12 and the final amplifier 13 perform amplification in accordance with the variation in the inputs. Thus the comparison operation is performed.

As shown in FIG. 7, a case where a pulsing noise occurs immediately before the completion of sampling will now be described. In this case, the reference voltage VR is supplied to the inputs of the differential amplifiers 11, 12 and final amplifier 13 through the switches S5, S6, S7, S8, S9, S10, and hence has a time constant with the capacitors C1, C2, C3, C4, C5, C6 serving as sampling capacitors. Therefore, the path that is charged from the reference voltage VR through the switches S5 through S10 cannot follow this noise.

On the other hand, the response of the differential amplifiers 11, 12 and the final amplifier 13 is sometimes sufficiently fast. However, in the present invention, the switch S21 provided between the positive input terminal of the differential amplifier 11 and the capacitor C1 is OFF, and hence the pulsing noise is not transmitted to the differential amplifier 11. The pulsing noise is transmitted from the connection point between the capacitor C1 and the switch S21 through the ON switch S6 and the ON switches S23 and S24, and is then input into the positive input terminal and negative input terminal of the differential amplifier 11 respectively. However, nothing more than noise having a substantially identical amplitude is input into the positive input terminal and negative input terminal of the differential amplifier 11, and hence there is no dramatic signal difference between the positive input terminal and negative input terminal. Accordingly, the noise makes almost no appearance in the output signal from the differential amplifier 11 as shown in FIG. 7.

Likewise, the pulsing noise is input into the differential amplifier 12 and final amplifier 13 through the respective switches S7, S8, S9, S10, but this noise makes almost no appearance in the respective output signals thereof. Hence malfunctions in which the voltage comparator is fixed in a state of 0 or 1 do not occur, and the output of the AD converter does not output all 0 data or all 1 data.

Note that in the example described above, the differential amplifiers 11, 12 have a two-stage constitution, but a three-stage constitution may also be provided.

It is apparent that the present invention is not limited to the above embodiment and it may be modified and changed without departing from the scope and spirit of the invention.

What is claimed is:

1. A successive approximation AD converter, comprising:
   a sampling capacitor adapted to receive an analog signal;
   a reference voltage supply section adapted to provide a reference voltage;
   a voltage comparator having an input terminal for receiving the analog signal via the sampling capacitor, and a second terminal into which the reference voltage is input from the reference voltage supply section;
   a successive approximation register connected to an output terminal of the voltage comparator; and
   a DA converter for converting data in the successive approximation register into an analog signal and inputting the analog signal into the first input terminal of the voltage comparator, wherein:
   the voltage comparator comprises:
      a capacitance pair;
      two differential amplifiers connected in series via the capacitance pair;
      a first switch connected between the sampling capacitor and a first one of the differential amplifiers;
      a second switch connected between a connection point between the first switch and the sampling capacitor and the reference voltage supply section; and
      a third switch connected between a connection point between the first switch and the first one of the differential amplifiers and the reference voltage supply section,
   when the input analog signal is applied to the voltage comparator input terminal to be sampled, the first switch is switched OFF, and the second switch and third switch are switched ON, and
   when a voltage comparison is executed, the first switch is switched ON, and the second switch and third switch are switched OFF.

2. The AD converter according to claim 1, further comprising a fourth switch connected between a connection point between the differential amplifiers and the reference voltage supply section,
   wherein, when the input analog signal is applied to the voltage comparator input terminal to be sampled, the fourth switch is switched ON, and when a voltage comparison is executed, the fourth switch is switched OFF.

3. The AD converter according to claim 1, further comprising a further capacitance provided on an output side of the second differential amplifier,
   wherein, when the input analog signal is applied to the voltage comparator input terminal to be sampled, an offset voltage output from the second differential amplifier is held in the further capacitance.

4. The AD converter according to claim 1, wherein, when a voltage comparison is executed, the differential amplifiers execute amplification processing in accordance with the input analog signal.

5. A voltage comparator apparatus, comprising:
   a comparator, including:
      a first input terminal adapted to receive an input signal;
      a capacitance pair;
      a second input terminal adapted to be connected to a reference voltage section;
      two differential amplifiers connected in series via the capacitance pair;
      a first switch connected between a sampling capacitor and a first one of the differential amplifiers; and
      a second switch connected between a connection point between the first switch and the first one of the differential amplifiers and the reference voltage supply section; and
   a third switch connected between a connection point between the first switch and the first input terminal and the reference voltage supply section, wherein:
   when the input analog signal is applied to the voltage comparator input terminal to be sampled, the first switch is switched OFF, and the second switch and third switch are switched ON, and
   when a voltage comparison is executed, the first switch is switched ON, and the second switch and third switch are switched OFF.

6. A successive approximation AD converter, comprising:
   a voltage comparator having first and second input terminals and an output terminal;
   a sampling capacitor having a first side connected to the first input of the voltage comparator;
   a successive approximation register connected to the output terminal of the voltage comparator;
   a DA converter for converting data in the successive approximation register into an analog signal;
   a reference voltage supply section;
   a first switch having a first contact adapted to receive an analog signal and a second contact connected to a second side of the sampling capacitor;
   a second switch connecting an output of the DA converter to the sampling capacitor;
   a second capacitor having a first side connected to the second input of the voltage comparator and a second side connected to the reference voltage supply section;
   a third switch connecting the second input of the voltage comparator to the reference voltage supply section;
   a fourth switch connecting the first input of the voltage comparator to the reference voltage supply section, wherein:
   the voltage comparator comprises:
      a plurality of differential amplifiers, each differential amplifier having a first input, a second input, a first output and a second output;

a fifth switch connecting the first input of the voltage comparator to the first input of a first one of the differential amplifiers;

a sixth switch connecting the second input of the voltage comparator to the second input of the first one of the differential amplifiers;

an output amplifier having a first input, a second input, and an output, the output of the output amplifier being connected to the voltage comparator output terminal;

a plurality of capacitance pairs, one capacitance pair connecting the first and second outputs of a second one of the differential amplifiers to the first and second inputs of the output amplifier, each remaining capacitance pair connecting the first and second outputs of one of the differential amplifiers to the first and second inputs of another one of the differential amplifiers so that the differential amplifiers are connected in series from the first one of the differential amplifiers to the second one of the differential amplifiers, and the second one of the differential amplifiers is in series with the output amplifier;

a plurality of further switches connecting the first and second inputs of the differential amplifiers and the output amplifier to the reference voltage supply section;

when the input analog signal is applied to the voltage comparator input terminal to be sampled, the first switch, the third switch, the fourth switch, and the plurality of further switches are switched ON, and the second switch, the fifth switch, and the sixth switch are switched OFF, and when a voltage comparison is executed, the first switch, the third switch, the fourth switch, and the plurality of further switches are switched OFF, and the second switch, the fifth switch, and the sixth switch are switched ON.

7. A voltage comparator apparatus, comprising:

a voltage comparator including:

a first input terminal adapted to receive an input signal;

a second input terminal adapted to be connected to a reference voltage supply section;

an output terminal;

a plurality of differential amplifiers, each differential amplifier having a first input, a second input, a first output and a second output;

a first switch connecting the first input terminal to the first input of a first one of the differential amplifiers;

a second switch connecting the second input terminal to the second input of the first one of the differential amplifiers;

an output amplifier having a first input, a second input, and an output, the output of the output amplifier being connected to the voltage comparator output terminal;

a plurality of capacitance pairs, one capacitance pair connecting the first and second outputs of a second one of the differential amplifiers to the first and second inputs of the output amplifier, each remaining capacitance pair connecting the first and second outputs of one of the differential amplifiers to the first and second inputs of another one of the differential amplifiers so that the differential amplifiers are connected in series from the first one of the differential amplifiers to the second one of the differential amplifiers, and the second one of the differential amplifiers is in series with the output amplifier; and a plurality of further switches connecting the first and second inputs of the differential amplifiers and the output amplifier to the reference voltage supply section;

a first additional switch having a first contact connected to a connection point between the first input terminal and the first input of the first differential amplifier and a second contact adapted to be connected to the reference voltage supply section; and a second additional switch having a first contact connected to a connection point between the second input terminal and the second input of the first differential amplifier and a second contact adapted to be connected to the reference voltage supply section, wherein:

when the input analog signal is applied to the voltage comparator input terminal to be sampled, the first additional switch, the second additional switch, and the plurality of further switches are switched ON, and the first switch the second switch are switched OFF, and when a voltage comparison is executed, the first additional switch, the second additional switch, and the plurality of further switches are switched OFF, and the first switch and the second switch ON.

8. A voltage comparator apparatus comprising:

an input terminal for receiving an analog signal;

a sampling capacitor having a first end which is coupled to the input terminal;

a reference voltage supply terminal adapted to provide a reference voltage;

a first differential amplifier having an analog signal input terminal and a reference terminal for receiving the reference voltage, and amplifying a voltage difference between the reference voltage and the analog signal input terminal;

a first switch coupled between a second end of the sampling capacitor and the analog signal input terminal of the first differential amplifier;

a second switch coupled between the second end of the sampling capacitor and the reference voltage supply terminal; and a third switch coupled between the analog signal input terminal of the first differential amplifier and the reference voltage supply terminal, when the analog signal is applied to the input terminal, the first switch is switched OFF to cut off noise propagation to the analog signal input terminal of the first differential amplifier, the second switch and the third switch are switched ON to storage the analog signal to the sampling capacitor and to supply the reference voltage to the analog signal input terminal of the first differential amplifier, and when a voltage comparison is executed, the first switch is switched ON, and the second switch and third switch are switched OFF.

9. The voltage comparator apparatus of claim 8, wherein the first differential amplifier comprises a pair of differential output terminals, and wherein the voltage comparator further comprises a second differential amplifier having a pair of differential input terminals coupled with the pair of differential output terminals of the first differential amplifier via a pair of capacitors.

* * * * *